Sept. 6, 1966 H. J. HARTMANN 3,271,632

METHOD OF PRODUCING ELECTRICAL SEMICONDUCTOR DEVICES

Filed May 18, 1962

2 Sheets-Sheet 1

INVENTOR
HORST J. HARTMANN

BY Percy P. Lantzy

ATTORNEY

Sept. 6, 1966 H. J. HARTMANN 3,271,632

METHOD OF PRODUCING ELECTRICAL SEMICONDUCTOR DEVICES

Filed May 18, 1962 2 Sheets-Sheet 2

INVENTOR
HORST J. HARTMANN

BY [signature]
ATTORNEY

United States Patent Office 3,271,632

Patented Sept. 6, 1966

3,271,632
METHOD OF PRODUCING ELECTRICAL SEMICONDUCTOR DEVICES

Horst Joachim Hartmann, Nurnberg, Germany, assignor to International Standard Electric Corporation, New York, N.Y., a corporation of Delaware Filed May 18, 1962, Ser. No. 195,805
Claims priority, application Germany, May 26, 1961, St 17,870
12 Claims. (Cl. 317—234)

Figure 1:
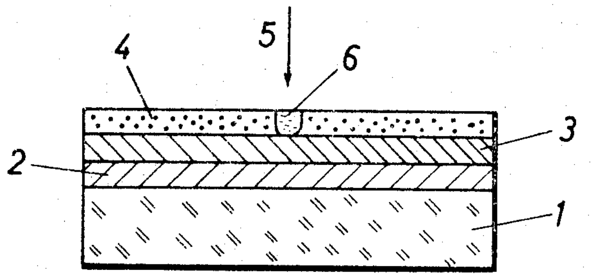

The present invention relates to a method of producing electrical semiconductor devices of such materials as germanium and silicon, having plane-shaped pn-junctions. In particular the invention relates to the production of pn-junctions of very small area for tunnel diodes and transistors of extremely small capacity for use at very high frequencies.

Various methods are now employed for producing pn-junctions, of which the most well-known ones are the alloying method and the diffusion method. In both cases, impurity substances are brought into a crystalline, preferably mono-crystalline, semiconductor body at a high temperature. As a result a large area, preferably on the surface of the semiconductor body, is changed to the opposite conductivity type. In accordance with conventional methods, however, it is difficult to produce conversion areas of an exactly defined size and surface, and of a certain depth. In particular it is difficult to produce exactly defined conversion areas of a very small size.

The present invention proposes a method of producing electrical semiconductor devices by which it is possible to produce pn-junctions of exactly defined dimensions and of very small areas.

The method may be utilized with germanium, silicon or similar semiconductor materials which have at least one planar pn-junction of preferably very small area. An amorphous semiconductor layer is evaporated onto a crystalline semiconductor layer of a certain conductivity type. The amorphous layer, containing doping additives that are opposite in relation to the crystalline layer, is melted at one or several locally limited points so that upon cooling of the melt there is formed a crystalline area of the same orientation as the crystalline semiconductor layer lying undereneath, but having an opposite conductivity type.

According to the further embodiment of the invention, the melting of the limited areas of the amorphous semiconductor layer is effected with the aid of an electron beam. In this way it is possible to melt very small areas of exactly defined dimensions.

The application of the semiconductor layers, particularly the amorphous semiconductor layer, is preferably effected by evaporation in a vacuum. For producing a crystalline semiconductor layer the semiconductor material is evaporated in a known manner onto a heated support or base and the amorphous semiconductor layer, produced by evaporation onto a cold support or base, may be converted into a crystalline layer in a known manner by subsequent heating.

Bodies or wafers of a conducting substance, such as metal, which simultaneously serves as the electric lead-in conductor for the finished semiconductor device may be used as the base onto which the semiconductor layers are evaporated. However, it is also possible to use non-conducting substances, such as wafers or glass, quartz, ceramic, or other similar materials to act as the carrier base. When using carriers of insulating material, a metal layer which serves as the lead-in conductor for the semiconductor device is evaporated first. Such a metal layer is similarly deposited by evaporation in a vacuum, but may also be applied in any other suitable manner to the carrier, such as by precipitation.

Finally, it is also possible to use a plate of crystalline, preferably mono-crystalline semiconductor material, as a carrier for the semiconductor layers on one or both sides of which there is deposited the amorphous semiconductor layer.

It is also possible to use a high-resistance plate of semiconductor material as the carrier, on which a crystalline semiconductor layer is produced in a known manner per se, by a chemical change or thermal decomposition of a corresponding semiconductor compound. An amorphous semiconductor layer is then deposited thereon.

In a presently known method of producing an electrical semiconductor device, an amorphous germanium layer is evaporated onto a crystalline germanium layer. In this conventional method, however, no portion of the amorphous semiconductor layer is melted, but a point electrode of molybdenum or tungsten is topped onto the amorphous semiconductor layer.

It is also known to produce a thin layer of material of an opposite conductivity type on a semiconductor body of one conductivity type, and to melt small portions of the thin surface layer, so that these portions are changed into the original conductivity type of the semiconductor body.

In contradistinction thereto, however, the subject matter of the present application relates to the melting of locally limited areas in an amorphous semiconductor layer containing certain doping additives. Such an amorphous semiconductor layer represents an isolator, and has the added advantage that the surface of the semiconductor body is protected by the amorphous layer against impurities, and that the pn-junction, from the moment of creation, is nowhere exposed to the free surface of the semiconductor.

Of course, it is also known to melt locally limited portions within a semiconductor with the aid of an electron beam, but up to now the melting with the aid of the electron beam was not used to melt narrow-limited areas in an amorphous semiconductor layer for the purpose of changing it into the crystalline state.

With the aid of the instant novel method it is possible in a simple way to produce semiconductor devices for various purposes, by changing several areas in the amorphous semiconductor layer into the crystalline state by local melting and cooling. The changed or converted areas may be lying so close to one another that it is possible to achieve transistor-like effects. In a simple way it is also possible to produce several semiconductor devices next to each other on one base.

After the crystalline areas have been produced in the amorphous semiconductor layer, they are provided with contacts. The contacts may be produced in a known manner by evaporating metal layers, or by melting, welding or alloying wires or planar contacts of a suitable material.

Some examples of embodiments of the method according to the invention will now be explained in detail with reference to the accompanying drawings.

Figure 2:
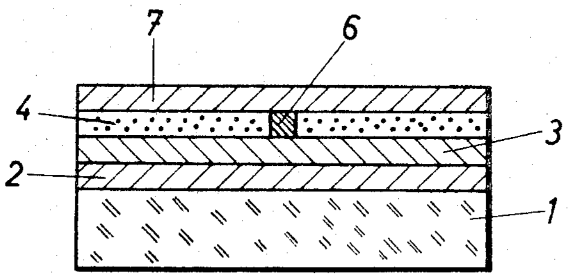

FIGS. 1 and 2, in a sectional view, show some semiconductor devices having diode effects, in different steps of manufacture.

Figure 3:
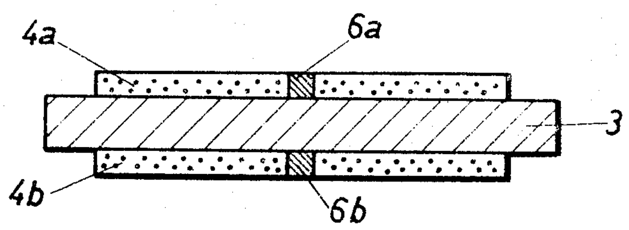

FIG. 3, in a sectional view, shows the manufacture of a semiconductor device having a transistor-like effect.

Figure 4:
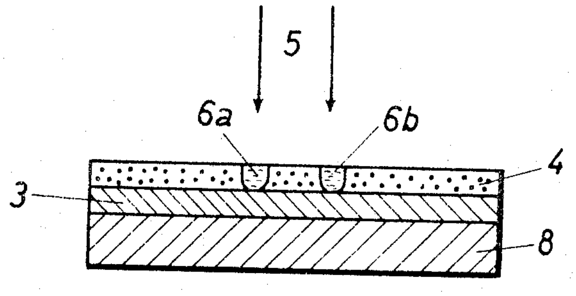

FIG. 4, in a sectional view, shows another type of embodiment of a semiconductor device having a transistor-like effect.

Figure 5A:
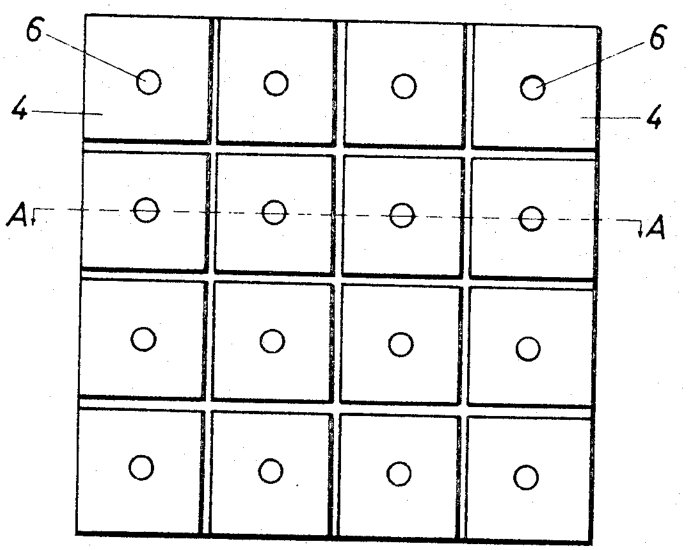
Figure 5B:
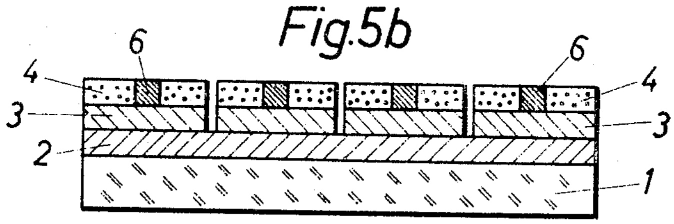

FIGS. 5*a* and 5*b*, in both a top and sectional view, show an arrangement in which several semiconductor diodes are disposed on one common base plate.

In accordance with the principles of the invention, an amorphous semiconductor layer is evaporated onto a crystalline semiconductor layer of predetermined conductivity type. The amorphous layer contains additives for producing a conductivity type which is in opposition to that of the crystalline semiconductor layer. The crystalline semiconductor layer may be of the mono-crystalline of poly-crystalline type. For example, if the crystalline semiconductor layer is of the n-type conductivity then, onto the latter, there is evaporated an amorphous semiconductor layer with additives producing a p-type conductivity in the respective semiconductor. Subsequently thereto, narrow restricted areas in the amorphous semiconductor layer are melted, preferably by the effect of a sharply focussed and highly accelerated electron beam. The time of action of the electron beam only needs to be very short, because the thin amorphous semiconductor layer is very quickly heated to its melting point. In this way very small spot-shaped areas can be melted in the amorphous semiconductor layer. During the melting process, the electron beam may also be deflected, or the base may be moved in a suitable way, so that areas of any suitable shape and size can be melted. If, during the movement of the base, or during the deflection of the electron beam, the beam is pulsed, it is possible to obtain numerous spot-shaped melting zones next to each other, as will be described hereinafter with reference to FIGS. *5a* and *5b*.

The melted semiconductor material wets the crystalline base and hardens to a crystalline shape, so that due to the additives of opposite polarity inserted into the amorphorus semiconductor layer, a pn-junction is formed at this point, the area of which corresponds to the size of the melted zone.

By suitably dimensioning the thickness of the amorphous semiconductor layer, as well as by sharply focussing the electron beam, it is possible to produce pn-junctions of very small area and of exactly defined dimensions. The time during which the heat is permitted to act upon the layer is very short in this case, because the melting of the material by the electron beam, is performed very rapidly, after which the electron beam can be switched off immediately. For this reason there will be no noteworthy thermal diffusion of the doping parasitic atoms from the crystalline base into the melt, or vice versa, so that pn-junctions of an abrupt type are obtainable. This is particularly important with respect to tunnel diodes, having high peak current densities. However, if a pn-junction with a flatter characteristic is desirable, it is possible to effect a thermal diffusion and, consequently, a widening of the pn-junction by a longer action of the electron beam or by subjecting it to a subsequent heat treatment below the melting point.

The crystalline base may either be obtained in the conventional manner by cutting-through a semiconductor crystal, having corresponding doping, or else by evaporating the semiconductor material onto a suitable carrier. In this operation, as is well-known, the carrier is kept at a higher temperature during evaporation, or else the amorphous semiconductor layer may be converted into a crystalline layer by subjecting it to a subsequent heat treatment. Preferably, the amorphous semiconductor layer is produced by evaporation onto the crystalline semiconductor layer which is not heated in this case. For example, it is known that during the evaporation of germanium onto a carrier or base, it is possible to obtain amorphous layers provided that the base is kept at temperatures below 400° C., whereas in the case of base temperatures ranging above 400° C., crystalline layers are obtainable.

The doping of the amorphous semiconductor layer is effected in such a way that doped semiconductor material may be evaporated, or the semiconductor material and the doping material can be evaporated in a corresponding relationship from different vaporizers at the same time. It is also possible to evaporate both the semiconductor material and the doping material one at a time in turn.

FIGS. 1 and 2 show two different stages of manufacturing a diode according to the inventive methd.

The reference numeral 1 in FIGS. 1 and 2 indicates the carrier or base of insulating material, e.g. of glass or quartz. Onto this base there is evaporated a metal layer 2, in vacuo. This metal layer forms the lead-in conductor for the crystalline semiconductor layer 3 evaporated thereon, and which is also produced by evaporation in vacuo onto the heated base.

Thereafter, onto the crystalline semiconductor layer 3, the amorphous semiconductor layer 4 is deposited by way of evaporattion. The layer 4 contains doping substances for producing the conductivity type which is in opposition to that of the crystalline semiconductor layer 3. By the action of the electron beam 5 (FIG. 1), a predetermined limited area 6 of the amorphous semiconductor layer 4 is melted. Upon solidifying of the melt the crystalline are 6 (FIG. 2) is produced, having a type of conductivity which is opposite to that of the crystalline semiconductor layer 3. Thus, between layer 6 and layer 3, a pn-junction is formed whose dimension corresponds to that of the area of the amorphous semiconductor layer 4 melted by the action of the electron beam. The amorphous semiconductor layer 4 represents an insulator, and simultaneously forms a protective layer for the surface of the semiconductor and, in particular for the pn-junction.

Finally, another contact layer 7 is deposited onto the amorphous semiconductor layer, by evaporating a suitable metal. Thus, it is possible to avoid the difficulties normally resulting from contact with the small re-crystallization area 6.

FIG. 3 shows a further semiconductor device which is capable of being manufactured in accordance with the inventive method.

In this case a wafer of a mono-crystalline semiconductor material, preferably a very thin wafer, is used as the base or carrier. On both sides of the wafer 3 there is deposited a thin amorphous semiconductor layer **4*a* and 4*b* respectively, in which two crystalline areas 6*a* and 6*b* are produced by local melting on opposite points. The crystalline areas and the crystal wafer 3** are then provided with contacts in a suitable manner.

A semiconductor device having a transistor-like effect may also be obtained in a similar way, as shown in FIG. 4. In this case a highly resistant mono-crystalline wafer 8 of a semiconductor material is used as the base on which the crystalline semiconductor layer is produced by a chemical change or thermal decomposition of a corresponding semiconductor compound, such as by epitaxial growth, growing in the same orientation as that of the high-resistant semiconductor wafer 8. The amorphous semiconductor layer 4 is now evaporated onto the crystalline semiconductor layer 3. By the action of an electron beam 5 two melting zones **6*a* and 6*b* are produced closely adjacent each other in the amorphous semiconductor layer 4. Upon solidification of the melted areas 6*a* and 6*b*** two PN-junctions are produced which are closely positioned. The semiconductor device is thus still provided with suitable contacts.

FIG. 5 shows a semiconductor device in which several individual semiconductor devices are arranged on one common base or support. Such a device may be used as a diode matrix.

FIG. *5a* is the top view of such a device, and FIG. *5b* is a section taken on the line A—A of FIG. *5a*.

On a suitable base 1, such as glass or quartz, there is deposited a metal layer 2. Subsequently thereto, and by using a raster-like mask, the crystalline semiconductor layers 3 are deposited and thereafter the amorphous semiconductor layers 4. By using the mask it is possible to produce several separated semiconductor areas.

In each of these semiconductor areas there is produced at least one melted zone which, upon solidification, will result in the re-crystallization areas 6. In FIGS. 5*a* and 5*b* only one re-crystallization area is shown for each semiconductor area; however, it is also possible to produce several such areas lying next to each other. The melting zones are obtained by deflection of the electron beam to sweep over the individual fields while being keyed in a pulsing operation.

Finally, the semiconductor device is obtained suitably provided with the contacts necessary at the re-crystallization areas 6.

Besides the presently shown and described semiconductor devices, it is possible to advantageously produce numerous other types in accordance with the invention method. The re-crystallization areas may have any suitable shape and size and may be disposed in any suitable relationship to one another. In any case, however, it is possible in accordance with the inventive method, to produce PN-junctions of exactly defined dimensions which are completely protected against external influences by the amorphous semiconductor layer.

What is claimed is:

1. A semiconductor device comprising a layer of crystalline semiconductor material of one conductivity type, a protective insulating layer of amorphous semicondutor material of another conductivity type deposited thereon, a predetermined limited surface area of said amorphous layer comprising a re-crystallized solidified melt zone of said other conductivity type forming an electrode extending through the full thickness of said amorphous layer in contact with and of the same orientation as said crystalline layer of said one conductivity type and forming a PN-junction therewith.

2. A method of producing electrical semiconductor devices comprising the steps of evaporating a protective insulating amorphous semiconductor layer containing doping additives of one conductivity type onto a crystalline semiconductor layer of opposite conductivity type, melting the said amorphous semiconductor layer at a first predetermined limited surface area to extend through the full thickness of said amorphous layer and cooling the melt to form an electrode having a limited crystalline area of the same orientation as and in contact with the surface of the crystalline semiconductor layer lying beneath, but of opposite conductivity type, and leaving said amorphous layer in place during subsequent processing steps.

3. A method according to claim 2, wherein the melting of a limited area is performed by an electron beam.

4. A method according to claim 2 including evaporating said crystalline semiconductor layer onto a heated base and cooling the base before evaporating said amorphous semiconductor layer.

5. A method according to claim 4, wherein the base is formed of insulating material and including depositing a metal layer thereon prior to the application of the crystalline semiconductor layer.

6. A method according to claim 2 including melting said amorphous semiconductor layer in a second area closely spaced from said first area.

7. A method according to claim 2, wherein said crystalline layer is formed of a thin plate of mono-crystalline semiconductor material and including evaporating said amorphous layer thereon.

8. A method according to claim 7, including evaporating amorphous semiconductor layers onto both sides of the plate of crystalline semiconductor material and melting areas opposite one another on both sides.

9. A method according to claim 2 wherein said crystalline layer is formed of a single-crystal wafer of highly resistant semiconductor material, and including evaporating an insulative amorphous layer thereon.

10. A method according to claim 7, including forming a plurality of adjacent separate mono-crystalline semiconductor layers on a common base, evaporating an amorphous semiconductor layer onto each said crystalline layer and melting a limited area in each of said amorphous semiconductor layers.

11. A process for manufacturing a passivated semiconductor device, comprising the steps of:

depositing an insulating layer of amorphous semiconductor material containing a substance selected from the group consisting of donor and acceptor impurities onto a mono-crystalline semiconductor layer of one conductivity type, said substance being capable of converting said insulating layer to opposite conductivity type;

melting a limited surface area of said insulating layer throughout the depth of said insulating layer;

allowing the melt to cool into a monocrystalline region of said opposite conductivity type forming a PN-junction with said monocrystalline layer; and depositing a metallic layer upon said insulating layer, said metallic layer being in electrical contact with and forming an electrode to said monocrystalline region.

12. A process according to claim 11, wherein said limited surface area is rapidly melted, and said PN-junction is an alloy junction.

References Cited by the Examiner

UNITED STATES PATENTS

| | | | |
|---|---|---|---|
| 2,780,569 | 2/1957 | Hewlett | 317—235 X |
| 2,816,847 | 12/1957 | Shockley | 148—188 |
| 2,845,371 | 7/1958 | Smith | 148—191 |
| 2,915,687 | 12/1959 | Allison | 317—241 |

JOHN W. HUCKERT, *Primary Examiner.*

A. S. KATZ, J. D. KALLAM, R. SANDLER, *Assistant Examiners.*